United States Patent
Vacassy et al.

(10) Patent No.: US 9,074,118 B2
(45) Date of Patent: Jul. 7, 2015

(54) CMP METHOD FOR METAL-CONTAINING SUBSTRATES

(75) Inventors: Robert Vacassy, Aurora, IL (US); Renjie Zhou, Brookfield, CT (US)

(73) Assignee: Cabot Microelectronics Corporation, Aurora, IL (US)

( * ) Notice: Subject to any disclaimer, the term of this patent is extended or adjusted under 35 U.S.C. 154(b) by 1696 days.

(21) Appl. No.: 12/309,212

(22) PCT Filed: Jul. 6, 2007

(86) PCT No.: PCT/US2007/015555
§ 371 (c)(1),
(2), (4) Date: Jan. 9, 2009

(87) PCT Pub. No.: WO2008/008282
PCT Pub. Date: Jan. 17, 2008

(65) Prior Publication Data
US 2009/0314744 A1    Dec. 24, 2009

Related U.S. Application Data

(60) Provisional application No. 60/830,233, filed on Jul. 12, 2006.

(51) Int. Cl.
| | | |
|---|---|---|
| *H01L 21/302* | (2006.01) |
| *B44C 1/22* | (2006.01) |
| *C23F 1/00* | (2006.01) |
| *C03C 15/00* | (2006.01) |
| *C03C 25/68* | (2006.01) |
| *C09K 13/00* | (2006.01) |
| *C09K 3/14* | (2006.01) |
| *C09G 1/02* | (2006.01) |
| *H01L 21/321* | (2006.01) |

(52) U.S. Cl.
CPC .............. *C09K 3/1436* (2013.01); *C09G 1/02* (2013.01); *H01L 21/3212* (2013.01)

(58) Field of Classification Search
USPC ......................................... 438/692
See application file for complete search history.

(56) References Cited

U.S. PATENT DOCUMENTS

| | | | | |
|---|---|---|---|---|
| 2,892,797 | A * | 6/1959 | Alexander et al. .............. 516/79 |
| 6,375,545 | B1 * | 4/2002 | Yano et al. ...................... 451/36 |
| 6,740,590 | B1 * | 5/2004 | Yano et al. ..................... 438/692 |
| 2005/0208883 | A1 | 9/2005 | Yoshida et al. |
| 2007/0037892 | A1 * | 2/2007 | Belov .............................. 516/79 |

FOREIGN PATENT DOCUMENTS

JP    2003-268353    9/2003

\* cited by examiner

*Primary Examiner* — Binh X Tran
*Assistant Examiner* — Thomas Pham
(74) *Attorney, Agent, or Firm* — Thomas E Omholt; Arlene Hornilla

(57) ABSTRACT

An aqueous chemical-mechanical polishing composition for polishing metal containing substrates comprising an abrasive particle consisting essentially of a primary particle modified with an aluminosilicate layer, and wherein the abrasive particle has a zeta potential measured at pH 2.3 of about −5 mV to about −100 mV. The composition can be used to polish the surface of a tungsten containing substrate.

20 Claims, 1 Drawing Sheet

Demonstration of the formation of an aluminosilicate layer on a primary abrasive particle.

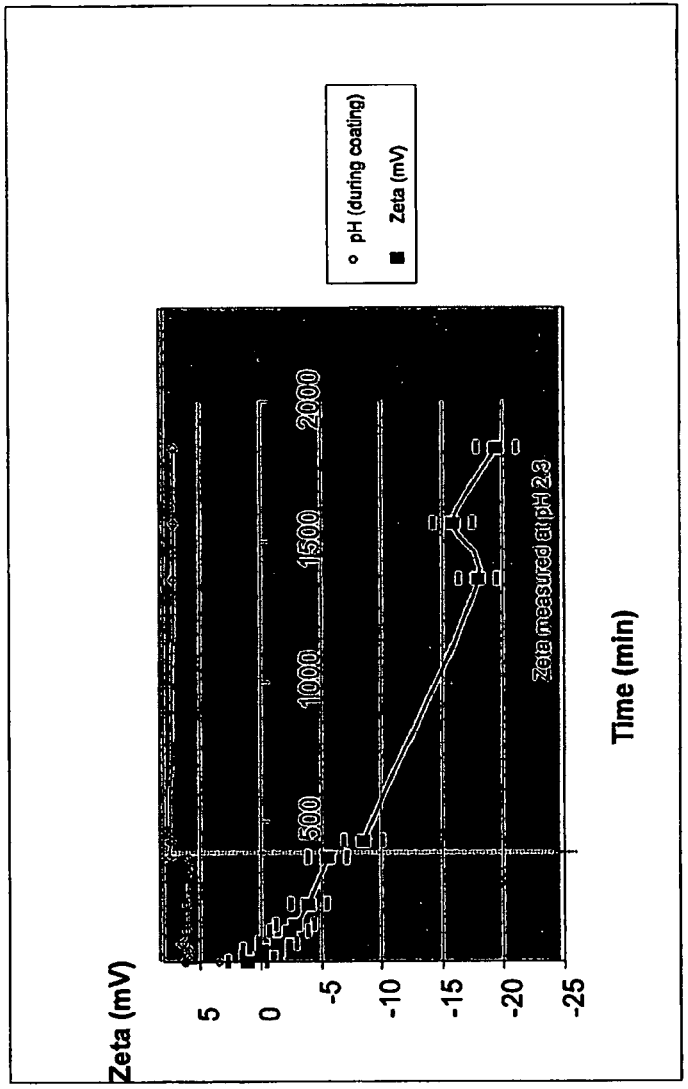
Demonstration of the formation of an aluminosilicate layer on a primary abrasive particle.

CMP METHOD FOR METAL-CONTAINING SUBSTRATES

FIELD OF THE INVENTION

This invention pertains to chemical-mechanical polishing compositions and methods for polishing a substrate using such compositions. In particular this invention relates to chemical-mechanical polishing compositions containing modified abrasive particles.

BACKGROUND OF THE INVENTION

Chemical-mechanical planarization is an enabling technology for the manufacturing of integrated circuits. Integrated circuits are generally mass produced by fabricating thousands of identical circuit patterns on a single semiconductor wafer and subsequently dividing them into identical die or chips. Semiconductor wafers are generally made of silicon. To produce the integrated circuit many process steps well known in the art are used to modify, remove, and deposit material onto the semiconductor wafer. These steps of deposition or removal are frequently followed by chemical-mechanical planarization (CMP). CMP is the process of planarizing or polishing a surface by the combination of chemical and mechanical forces. The CMP process enables the integrated circuit manufacturing by minimizing barriers to multilayer formation and metallization, as well as to smooth, flatten, and clean the surface.

One example of the CMP process involves holding a semiconductor substrate, such as a wafer, against a rotating polishing pad under controlled downward pressure. A polishing slurry is then deposited onto the polishing pad and contacts the substrate. The polishing slurry typically contains at least two components: chemical reactants and abrasive particles. The chemical reactants are typically simple complexing agents or oxidizers, depending on the materials to be polished, and acids or bases to control the pH. The abrasive particles are usually metal oxides and generally serve to mechanically abrade the surface, but can also contribute to the chemical action at the substrate surface.

The prior art has recognized the need for improved abrasive particles. Surface modified abrasives using organic silanes have been reported for achieving higher polishing rates and reducing agglomeration in the slurry (see for example U.S. Pat. No. 6,592,776 and U.S. Pat. No. 6,582,623). Another problem with abrasive particles is that they can stick to the polished substrate surface, resulting in contamination. This particle contamination can be difficult to wash away from the wafer and leads to higher defectivity and thus lowered yields in the integrated circuit manufacturing. There, thus, exits a need in the art for improved abrasive particles that have excellent polishing properties and result in low defectivity to the product.

BRIEF SUMMARY OF THE INVENTION

The invention provides a chemical mechanical polishing composition for polishing a substrate. The composition comprises surface modified abrasive particles having a zeta potential measured at pH 2.3 of at least −10 mV. The present invention further provides a composition comprising at least one oxidizer, at least one catalyst having multiple oxidation states; and abrasive particles comprising primary particles modified with an aluminosilicate layer; wherein the abrasive particles have a zeta potential measured at pH 2.3 of at least −10 mV.

The invention also provides a method of polishing a substrate using the chemical mechanical polishing composition of the instant invention. The invention further provides abrasive particles, for use in chemical-mechanical polishing, comprising primary particles modified with an aluminosilicate layer; wherein the abrasive particles have a zeta potential measured at pH 2.3 of at least −10 mV.

The polishing composition of the present invention and the methods of the present invention provide a low defectivity result while exhibiting excellent polishing properties to the substrate being polished.

BRIEF DESCRIPTION OF THE DRAWINGS

FIG. 1 illustrates an aluminosilicate layer is formed on a primary particle resulting in altering the zeta potential.

DETAILED DESCRIPTION OF THE INVENTION

The present invention provides a chemical-mechanical polishing (CMP) composition having low defectivity (defined as adhesion of the abrasive particle in the slurry, to the substrate) while still providing excellent polishing characteristics. The composition of the present invention comprises an abrasive particle comprising a primary particle having a modified surface, such that the net charge of the abrasive particle in the slurry is a like charge to the substrate being polished.

The primary particles of the composition of the present invention are surface modified with an aluminosilicate layer such that there is a net negative charge on the abrasive particles in the slurry. The primary particles can be any suitable particle for modifying with an aluminosilicate layer. Some exemplary primary particles are, without limitation, silica, alumina, ceria and clay.

The modified abrasive particles of the present invention have a zeta potential measured at pH 2.3 of at least −10 mV. As used herein, the zeta potential is the measure of the electrostatic charge at the surface of an abrasive particle. The magnitude of the zeta potential is indicative of the tendency for abrasive particles to repel other particles or surfaces with a like charge. Alternatively, the higher the magnitude of the zeta potentials between the two materials, the stronger the repulsion. For example, particles with a large negative zeta potential will repel other negatively charged particles or surfaces. Methods for the measurement of the zeta potential of particles are well known in the art. The zeta potential of the abrasive particles of the present invention can be measure by any suitable method. Without limitation, the zeta potential of the abrasive particles of the composition of the present invention can be measured by a combination of laser Doppler velocimetry and phase analysis light scattering. Specifically, the zeta potential values of the abrasive particles of the present invention are preferably determined by measurement with a Malvern Zeta Master 3000, (Malvem Instruments, Ltd., Worchestershire, UK).

One embodiment of the present invention is a chemical-mechanical polishing slurry containing surface modified abrasive particles comprising primary particles having an aluminosilicate monolayer coverage, such that there is a net negative charge on the abrasive particles in the slurry. The charge on the primary particles can be manipulated in many ways to arrive at an abrasive particle with a net negative charge. Without limitation, one such method is through physical vapor deposition (PVD) of an aluminosilicate layer on a silica particle. Similarly, a borosilicate layer can be deposited on a silica particle using PVD and result in a net negative charge. Yet another method of modifying a primary particle with an aluminosilicate layer to produce an abrasive particle with a net negative charge is to first form Al—O⁻ groups by reacting alumina with ammonium hydroxide. The Al—O⁻ thus formed is then reacted with silica primary particles at pH above about 3.0 resulting in an aluminosilicate monolayer on the silica particle. In this exemplified embodiment, described by the methods above, the aluminosilicate layer is achieved by reacting aluminum cations with the siloxane functionalities present at the surface of the silica primary particle. The result is an abrasive particle having an aluminosilicate monolayer and a net negative charge when suspended in the slurry composition of the present invention The abrasive particles are preferably suspended in the slurry composition of the present invention, and the suspension is preferably colloidally stable. The term "colloid" refers to the suspension of abrasive particles in the liquid carrier. The phrase "colloidally stable" refers to the maintenance of that suspension over time. In the context of this invention, a suspension of abrasive particle is considered colloidally stable if, when the abrasive particles are placed into a 100 mL graduated cylinder and allowed to stand without agitation for a time of 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the total concentration of particles in the abrasive composition ([C] in terms of g/mL) is less than or equal to 0.5 (i.e., ([B]−[T])/[C]≤0.5). The value of ([B]−[T])/[C] desirably is less than or equal to 0.3, and preferably is less than or equal to 0.1.

The modified abrasive particles can be present in the polishing composition in an amount ranging from about 0.01 wt. % to about 15 wt. %. Preferably the abrasive particles are present in an amount of about 0.05 wt. % to about 4 wt. %, more preferably about 0.5 wt. % to about 3 wt. %.

The CMP compositions of the present invention comprise a liquid carrier, in which the modified abrasive is suspended and other polishing components are dissolved or suspended. The liquid carrier of the present invention can comprise any of the suitable carriers well known in the art of CMP slurry compositions. In the present invention, water is the preferred liquid carrier. The water of the composition of the present invention is preferably deionized or distilled water.

The polishing compositions of the present invention include one or more oxidizing agents. As used herein, an oxidizing agent is an agent that can oxidize a component of the substrate surface, such as a metal component. Oxidizing agents suitable for use in the present invention include, without limitation, hydrogen peroxide, periodic acid, potassium iodate, tetraalkylammonium iodates, ferric nitrate, and organic oxidizers, and a combination of two or more of the foregoing. Preferably, the oxidizing agent is present in the composition in sufficient amounts to oxidize one or more selected metallic or semiconductor materials present in the substrate wafer. The oxidizing agent of the polishing composition of the present invention is preferably hydrogen peroxide.

The polishing compositions of the present invention can further comprise at least one catalyst. The catalyst may be metallic, non-metallic or a combination thereof. Preferably, the catalyst has multiple oxidation states. Most preferably, the catalyst is an iron catalyst. Suitable iron catalysts include inorganic salts of iron, such as iron (II) or iron (III) salts of nitrates, sulfates or halides (including fluorides, chlorides, bromides, iodides, perchlorates, perbromates and periodates); or an organic iron (II or III) compounds, such as acetates, acetylacetonates, citrates, gluconates, malonates, oxalates, phthalates, and succinates. More preferably, the iron catalyst is iron (II or III) nitrate.

The catalyst can be present in any suitable amount. Typically the catalyst can be present in an amount of about 0.001 wt. % to about 2 wt. %.

The polishing compositions of the present invention can further comprise a stabilizer. As used herein, the stabilizer inhibits the catalyst from reacting with the oxidizing agent. Suitable stabilizers include phosphoric acid; organic acids such as adipic acid, citric acid, malonic acid, orthophthalic acid, and ethylenediamine tetraacetic acid (EDTA); phosphonate compounds; nitrile compounds such as benzonitrile; and mixtures thereof. Preferably, the stabilizer is malonic acid.

The stabilizer can be present in any suitable amount. Typically, the stabilizer can be present in an amount ranging from about 1 equivalent per catalyst to about 15 equivalents per catalyst.

The polishing compositions of the present invention can have any suitable pH. Typically, the polishing composition has a pH of about 1 or more (e.g., about 2 or more). Preferably, the polishing composition has a pH of about 5 or less (e.g., about 4 or less). In one preferred embodiment, the polishing composition has a pH of about 2 to about 4 (e.g., about 2.3 to about 3.5).

The pH of the polishing composition can be achieved and/or maintained by any suitable means. More specifically, the polishing composition can further comprise a pH adjustor, a pH buffering agent, or a combination thereof. The pH adjustor can be any suitable pH-adjusting compound. For example, the pH adjustor can be nitric acid, ammonium hydroxide, potassium hydroxide, potassium carbonate, or a combination thereof. The pH buffering agent can be any suitable buffering agent, for example, phosphates, sulfates, borates, ammonium salts, and the like. The polishing composition can comprise any suitable amount of a pH adjustor and/or a pH buffering agent, provided that a suitable amount is used to achieve and/or maintain the pH of the polishing composition within the ranges set forth.

The polishing compositions of the invention also optionally can comprise one or more additives, such as a surfactant, a rheological control agent (e.g., a viscosity enhancing agent or coagulant), a biocide, and the like, many of which are well known in the CMP art.

The polishing compositions of the invention can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., acids, bases, and the like) as well as any combination of ingredients (e.g., acids, bases, surfactants, and the like). The pH can be adjusted at any suitable time.

The polishing compositions of the present invention also can be provided as a concentrate, which is intended to be diluted with an appropriate amount of water prior to use. In such an embodiment, the CMP composition concentrate can include the various components dispersed or dissolved in aqueous solvent in amounts such that, upon dilution of the concentrate with an appropriate amount of solvent, each component of the polishing composition will be present in the CMP composition in an amount within the appropriate range for use.

The invention also provides a method of chemically-mechanically polishing a substrate comprising (i) contacting a substrate with a polishing pad and a CMP composition described herein, and (ii) moving the polishing pad relative to the substrate with the polishing composition therebetween, thereby abrading at least a portion of the substrate to polish the substrate.

The CMP methods of the present invention can be used to polish any suitable substrate, and is especially useful for polishing substrates comprising metallic components such as tungsten, copper, ruthenium, tantalum, and the like.

The CMP methods of the present invention are particularly suited for use in conjunction with a chemical-mechanical polishing apparatus. Typically, the CMP apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and a polishing composition of the present invention and then moving the polishing pad relative to the substrate, so as to abrade at least a portion of the substrate to polish the substrate.

The polishing pad of the polishing apparatus can be any suitable polishing pad, many of which are known in the art. Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

The polishing pad can have any suitable configuration. For example, the polishing pad can be circular and, when in use, typically will have a rotational motion about an axis perpendicular to the plane defined by the surface of the pad. The polishing pad can be cylindrical, the surface of which acts as the polishing surface, and, when in use, typically will have a rotational motion about the central axis of the cylinder. The polishing pad can be in the form of an endless belt, which when in use typically will have a linear motion with respect to the substrate wafer being polished. The polishing pad can have any suitable shape and, when in use, have a reciprocating or orbital motion along a plane or a semicircle. Many other variations will be readily apparent to the skilled artisan.

The present invention also provides a method of polishing a substrate with the polishing composition described herein. Further, the present invention also provides an abrasive particle for use in CMP compositions, comprising a primary particle comprising silica, surface modified to form an aluminosilicate layer, wherein the abrasive particle has a zeta potential measured at pH 2.3 of about −5 mV to about −100 mV.

The following examples are provided to further describe the invention, and should not be construed as in any way limiting the scope.

Example 1

This example illustrates one method of preparing negatively charged particles for use in tungsten CMP slurry formulations. An aliquot of 29.45 g of a 14.4% suspension of fumed silica particles was suspended in deionized water to give a final concentration of 1.72 wt. % particles in a total volume of 247.5 ml. Then, 2.5 ml of a 0.1M solution of aluminum nitrate ($Al(NO_3)_3 \cdot 9H_2O$) was added to the suspension. The pH of the mixture was increased to 6.0 by adding ammonium hydroxide solution (29%) and the mixture was left under agitation for 6 hours. The zeta potential of the particles was recorded over time using a Malvern Zeta Master 3000 (Malvern Instruments, Ltd., Worchestershire, UK). In order to measure the zeta potential, a few drops of the mixture were removed and added to a water-based solution pH-adjusted to 2.3 using nitric acid. A zeta potential of −5.5 mV was obtained (FIG. 1), indicating that an aluminosilicate layer had formed (the zeta potential of silica at pH 2.3 is zero). The pH of the mixture was increased to 7.5 with a 29% ammonium hydroxide solution. This resulted in the particle charge dropping to −8 mV immediately, and to about −20 mV after 24 hours (FIG. 1).

Example 2

This example illustrates the ability to control the thickness and charge density of the aluminosilicate layer on the silica particles, and hence the particle charge, by adjusting the pH. The particles were treated as described in Example 1, except that the pH was increased to 9.0 instead of 7.5, using a 29% ammonium hydroxide solution. After 24 hours the zeta potential of the particles was −30 mV (measured at pH 2.3).

Example 3

This example demonstrates the effect on removal rate using the particles of the present invention.

These polishing experiments were conducted using an Integrated Process Equipment Corp. (IPEC, San Jose, Calif.) Avanti 472 polishing tool and 200 mm test wafers. All experiments used an IC 1000™ polishing pad (Rodel Inc., Phoenix, Ariz.) and the following process conditions:

| | |
|---|---|
| Down force | 5 psi |
| Back pressure | 0 psi |
| Platen speed | 60 rpm |
| Carrier speed | 40 rpm |

The control slurry was the commercially available Semi-Sperse® W2000 (Cabot Microelectronics Corp., Aurora, Ill.). The experimental slurries used the same formulation as the commercial slurry, except that the abrasive was replaced with the surface modified abrasive described in Examples 1 and 2, above. In all treatments, the surface modified abrasive was prepared just prior to addition to the slurry.

The first set of polishing experiments compared two different abrasive concentrations (3 and 1% solids) and oxidizer concentrations (1 and 4% hydrogen peroxide).

The results, shown in Table 1, indicate that the higher concentration of oxidizer is necessary for higher removal rates using the particles of the present invention. Additionally, there was no effect on removal rates with the particle concentrations of 3 and 1% solids.

TABLE 1

| Abrasive Particle (% solids) | Oxidizer (wt. % $H_2O_2$) | Abrasive Particle Treatment | W Removal Rate (Å/min) |
|---|---|---|---|
| 3 | 4 | Surface modified | 2622 |
| 3 | 1 | Surface modified | 1625 |
| 1 | 4 | Surface modified | 2649 |

Example 4

This example demonstrates the effect of the abrasive particles of the present invention on oxide erosion in tungsten pattern wafers.

The polishing experiments were conducted on the same equipment and using the same base slurry as described above in Example 3. The control experiment used a slurry containing the primary fumed silica particle that was modified as described in Example 1. As above, the tungsten removal rates were determined with blanket wafers. The amount of oxide erosion (in Å) that occurred during substrate polishing using each of the polishing compositions was determined for three regions of the substrate including regions of 50% line density (0.35 micron line with 0.35 micron spacing), 72% line density (0.9 micron line with 0.35 micron spacing), and 83% line density (2.5 micron line with 0.5 micron spacing). This erosion evaluation used Praesagus 200 mm tungsten pattern wafers (Praesagus Inc., San Jose, Calif.).

The results of these polishing experiments are shown in Table 2. The results show that the treated particle of the present invention improved erosion in wafers at 50 and 83% density without adversely affecting the removal rate of tungsten. The results also indicate that lowering the concentration of surface modified abrasive in the slurry, to a solids content of 0.5%, reduced the removal rate but still improved the erosion when compared to the unmodified particle. This experiment demonstrated that the surface modified abrasive particle of the present invention improves the erosion effect while still providing a good tungsten removal rate.

TABLE 2

| Abrasive Particle (% solids) | Oxidizer (wt. % $H_2O_2$) | Abrasive Particle Treatment | W Removal Rate (Å/min) | Erosion at 50% density (Å) | Erosion at 72% density (Å) | Erosion at 83% density (Å) |
|---|---|---|---|---|---|---|
| 1 | 4 | Control | 3052 | 821 | 799 | 2648 |
| 0.5 | 4 | Surface modified | 2074 | 720 | 809 | 2387 |
| 1 | 4 | Surface modified | 2993 | 593 | 802 | 2318 |

Example 5

This example shows the effect of particle stability on tungsten removal rates and erosion.

The slurries described in Example 3 above were allowed to age overnight at room temperature. The zeta potentials of the aged abrasive particles were measured as described above. The results showed that the zeta potentials of the surface modified abrasive particles were lower than the expected values after an overnight incubation (pH 2.3). This indicated that the covalent aluminosilicate bonding is reversible at low pH. The aged particles were then used in the CMP process described above in Example 3. The results indicate that the tungsten removal rate was slightly higher, but the erosion was slightly worse.

Example 6

This example demonstrates that the surface modified particles of the present invention have significantly reduced adhesion to the tungsten lines on a substrate after chemical-mechanical polishing.

These polishing experiments were conducted on an Ebara Frex 200 mm polishing tool (Ebara Technologies Inc., Sacramento, Calif.) and using an IC 1000™ polishing pad, under the following process conditions:

| | |
|---|---|
| Platen Speed | 100 rpm |
| Carrier Speed | 55 rpm |
| Sub-Carrier Pressure | 225 hPa (3.1 psi) |
| Back Side Pressure | 225 hPa (3.1 psi) |
| Ring Pressure | 200 hPa (2.7 psi). |
| Slurry Flow | 150 ml/min |

The slurry treatments were as described above in Example 2, with the control slurry having fumed silica as the abrasive particle. The inventive treatment slurry contained the surface modified abrasive particles of the present invention, prepared as described above, and having a zeta potential of greater than −20 mV. The slurry was tested using a "standard" polishing recipe known to minimize particle residue on a tungsten wafer surface. This recipe involves the best combination among wafer sequence, conditioning recipe and cleaning methodology. We also ran the slurry with a "modified" recipe known to generate a lot of particle residue at the surface of a tungsten wafer. The defectivity was measured for the wafers following polishing. The defectivity was defined as the number of particle counts at the surface of the wafer detected using a Kla-Tencor SP1 tool.

The results are shown in Table 3. As can be seen, the slurry containing the particles of the present invention showed a dramatic reduction in defectivity while maintaining a good removal rate for tungsten.

TABLE 3

| | Standard | Modified |
|---|---|---|
| Control | 18 | 745 |
| Inventive | 8 | 177 |

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition comprising:
   a. at least one oxidizer
   b. at least one catalyst having multiple oxidation states; and
   c. an abrasive comprising an abrasive particle consisting essentially of a primary particle modified with an aluminosilicate layer, and wherein the abrasive particle has a zeta potential measured at pH 2.3 of about $^-5$ mV to about $^-100$ mV.

2. The composition according to claim 1 wherein the primary particle is selected from the group consisting of silica, alumina, ceria, and clay.

3. The composition of claim 2, wherein the primary particle is silica.

4. The composition of claim 3 wherein the silica is fumed silica.

5. The composition according to claim 1 wherein the at least one oxidizer is hydrogen peroxide.

6. The composition according to claim 5 wherein the hydrogen peroxide concentration is from about 1 wt. % to about 6 wt. % of the composition.

7. The composition of claim 1 further comprising a stabilizer which inhibits the at least one catalyst from reacting with the at least one oxidizer.

8. The composition of claim 7 wherein the stabilizer is malonic acid.

9. The composition according to claim 1 wherein the abrasive particles have a zeta potential of about −10 mV to about −50 mV.

10. The composition according to claim 1 wherein the concentration of the abrasive particles is from about 0.05 wt. % to about 4 wt. % of the composition.

11. The composition of claim 1 wherein the at least one catalyst is ferric nitrate.

12. A method of chemical mechanical polishing, said method comprising:
   (i) providing a substrate comprising tungsten;
   (ii) providing a polishing composition comprising:
      (a) at least one oxidizer
      (b) at least one catalyst having multiple oxidation states; and
      (c) an abrasive comprising an abrasive particle consisting essentially of a primary particle modified with an aluminosilicate layer, and wherein the abrasive particle has a zeta potential measured at pH 2.3 of about $^-5$ mV to about $^-100$ mV,
   (iii) contacting the substrate with a polishing pad and the polishing composition,
   (iv) moving the substrate relative to the polishing pad and the polishing composition, and
   (v) abrading at least a portion of the substrate to polish the substrate.

13. The method of claim 12 wherein the at least one oxidizer is hydrogen peroxide.

14. The method of claim 13 wherein the hydrogen peroxide concentration is about 1 wt. % to about 5 wt. % of the polishing composition.

15. The method of claim 12 wherein the abrasive particles have a zeta potential of about −10 mV to about −50 mA.

16. The method of claim 12 wherein the primary particles comprise silica.

17. The method of claim 12 wherein the concentration of the abrasive particles is from about 0.05 wt. % to about 4 wt. % of the composition.

18. An abrasive particle for use in chemical mechanical polishing comprising a silica particle having an aluminosilicate layer, wherein the abrasive particle has a zeta potential measured at pH 2.3 of about −5 mV to about −100 mV.

19. The abrasive particle of claim 18 wherein the abrasive particle has a zeta potential measured at pH 2.3 of about −10 mV to about −50 mV.

20. The abrasive particle of claim 18 wherein the silica particle is fumed silica.

* * * * *